United States Patent
Kono

(10) Patent No.: US 7,679,240 B2
(45) Date of Patent: Mar. 16, 2010

(54) VIBRATION MOTOR

(75) Inventor: Kenji Kono, Ueda (JP)

(73) Assignees: Sanyo Electric Co., Ltd., Moriguchi-shi (JP); Sanyo Seimitsu Co., Ltd., Ueda-shi (JP)

( * ) Notice: Subject to any disclaimer, the term of this patent is extended or adjusted under 35 U.S.C. 154(b) by 0 days.

(21) Appl. No.: 12/199,908

(22) Filed: Aug. 28, 2008

(65) Prior Publication Data

US 2009/0079282 A1 Mar. 26, 2009

(30) Foreign Application Priority Data

Sep. 20, 2007 (JP) .............................. 2007-243592

(51) Int. Cl.
*H02K 7/06* (2006.01)
(52) U.S. Cl. ......................................... 310/81; 310/91
(58) Field of Classification Search .................... 310/81, 310/89, 91
See application file for complete search history.

(56) References Cited

U.S. PATENT DOCUMENTS

| | | | | |
|---|---|---|---|---|
| 6,081,055 | A | * | 6/2000 | Narusawa ..................... 310/81 |
| 6,133,657 | A | * | 10/2000 | Semenik et al. ............... 310/81 |
| 7,023,114 | B2 | * | 4/2006 | Takagi et al. .................. 310/81 |
| 2005/0073205 | A1 | * | 4/2005 | Takagi et al. .................. 310/89 |
| 2005/0206257 | A1 | * | 9/2005 | Takagi et al. .................. 310/81 |
| 2006/0284501 | A1 | * | 12/2006 | Takagi et al. .................. 310/81 |
| 2007/0241626 | A1 | * | 10/2007 | Suzuki et al. ................. 310/71 |
| 2008/0309180 | A1 | * | 12/2008 | Suzuki et al. ................. 310/81 |

* cited by examiner

*Primary Examiner*—Quyen Leung
*Assistant Examiner*—Leda Pham
(74) *Attorney, Agent, or Firm*—Kratz, Quintos & Hanson, LLP

(57) ABSTRACT

A vibration motor having an eccentric weight 20 includes a tubular metal holder frame 30 with a flat bottom part 31 and a wall surface 32, the flat bottom part 31 having an inner projection 31*f* with a bottom-up recess part W, the upper wall surface 32 being domed; a pair of external terminal pieces 14 and 15 attached to a plastic end cap 13, wherein the plastic end cap 13 has spacer projections 13*b* and 13*c* inserted between the motor case 11 and the flat bottom part 31.

2 Claims, 7 Drawing Sheets

VIBRATION MOTOR

CROSS-REFERENCE TO RELATED APPLICATIONS

This application is based upon and claims a priority of Japanese Patent Application No. 2007-243592, filed Sep. 20, 2007, the contents being incorporated herein by reference.

BACKGROUND OF THE INVENTION

1. Field of the Invention

The present invention relates to a vibration motor suitable for mounting on a printed circuit board by reflow soldering.

2. Description of the Related Art

As a vibration motor of a structure suitable for surface mounting on a printed circuit board, as disclosed in Japanese Patent Publication (A) No. 11-234943, there is known one having a motor body with an eccentric weight attached to one end of a motor shaft, a metal holder frame provided with a pair of sandwiching pieces for fitting a motor case of the motor body from its upper portion and holding that motor case, and a pair of external terminal pieces attached to a plastic end cap for closing an opening of the motor case at the side opposite to the eccentric weight, wherein the flat back surface of the metal holder frame and a pair of external terminal pieces are adhered to bonding patterns and a pair of power feed patterns by coating cream solder and are fixed by reflow soldering.

However, the above vibration motor has had the following problems.

Since the motor case is fitted by an elastic force derived by the pair of the sandwiching pieces which are open at their upper side, the motor case tends to be unfastened from the sandwiching pieces or the sandwiching force tends to be loosened when a mobile phone, which mounts the vibration motor with the heavy eccentric weight, receives a shock when it is fallen or the like. Therefore, the prior-art vibration motor has a disadvantage of low reliability against shock. In addition, the flat back surface of the metal holder frame is provided with a bottom-up recess portion for pooling solder so that the motor case must have flat sides in order to stably fit the motor case, which is held by the pair of the sandwiching pieces, against the bottom up surface of the bottom-up recess portion. Therefore, the vibration motor has a structure not suitable for the use of a motor case with a round circumferential surface.

SUMMARY OF THE INVENTION

In view of the above problem, an object of the present invention is to provide a vibration motor having a structure in which a motor case is not easily unfastened from a metal holder frame at the time when the vibration motor receives a shock.

According to a first aspect of the present invention, there is provided A vibration motor comprising: a vibration motor main body provided with a motor shaft projected from a motor case, an eccentric weight being attached to the motor shaft; a metal holder frame having a tubular shape and being provided with a flat bottom part and a wall surface, the flat bottom part having an inner projection with a bottom-up recess part, the wall surface having a domal structure rising up from both-side edges of the flat bottom part; and a pair of external terminal pieces attached to a plastic end cap for closing an opening of the motor case at the side opposite to the eccentric weight; wherein the plastic end cap integrally has a pair of spacer parts inserted between the motor case and the inner sides of the both-side edges of the flat bottom part.

Since the metal holder frame does not have the pair of sandwiching pieces having a domal structure rising up from both-side edges of a flat bottom part, and the motor case has a cylindrical shape to be inserted in the axial direction to be held, the holding of the motor case does not tend to leave from the metal holder frame even when a shock is generated. In addition, since the spacer projections of the plastic end cap are inserted between the motor case and the both-end edges of the flat bottom part by wedge pressure, the holding of the motor case does not tend to be loosened so that the impact resistance can be improved. When the motor case having the round circumferential surface is inserted into the metal holder frame, the circumference if the motor case will elastically run on the inside projection so as to be tightly fastened by the motor case with the round circumferential surface can be fixed and held.

It is preferable that the metal holder frame integrally comprises tapered projections each having a rectangular cross section, the tapered projections being projected to the both sides of the eccentric weight from the both-side edges of the flat bottom part. When the vibration motor is mounted on the printed wiring board, the vibration motor can be prevented from being fallen forward by the heavy eccentric weight due to the supporting function of the tapered projections. In addition, the fixing area can be expanded. In particular, since each of the tapered projections has the rectangular cross section, the rigidity against deflection becomes high so that any deformation due to bent over of the tapered projections when a shock is generated can be prevented

BRIEF DESCRIPTION OF THE DRAWINGS

These and other objects and features of the present invention will become clearer from the following description of the preferred embodiments given with reference to the attached drawings, wherein:

FIG. 5A is a front view of metal holder frame of the vibration motor, while

FIG. 6A is a plane view of the metal holder frame, while FIG. 7A is a right side view of the metal holder frame, while

DESCRIPTION OF THE PREFERRED EMBODIMENTS

Figure 1:
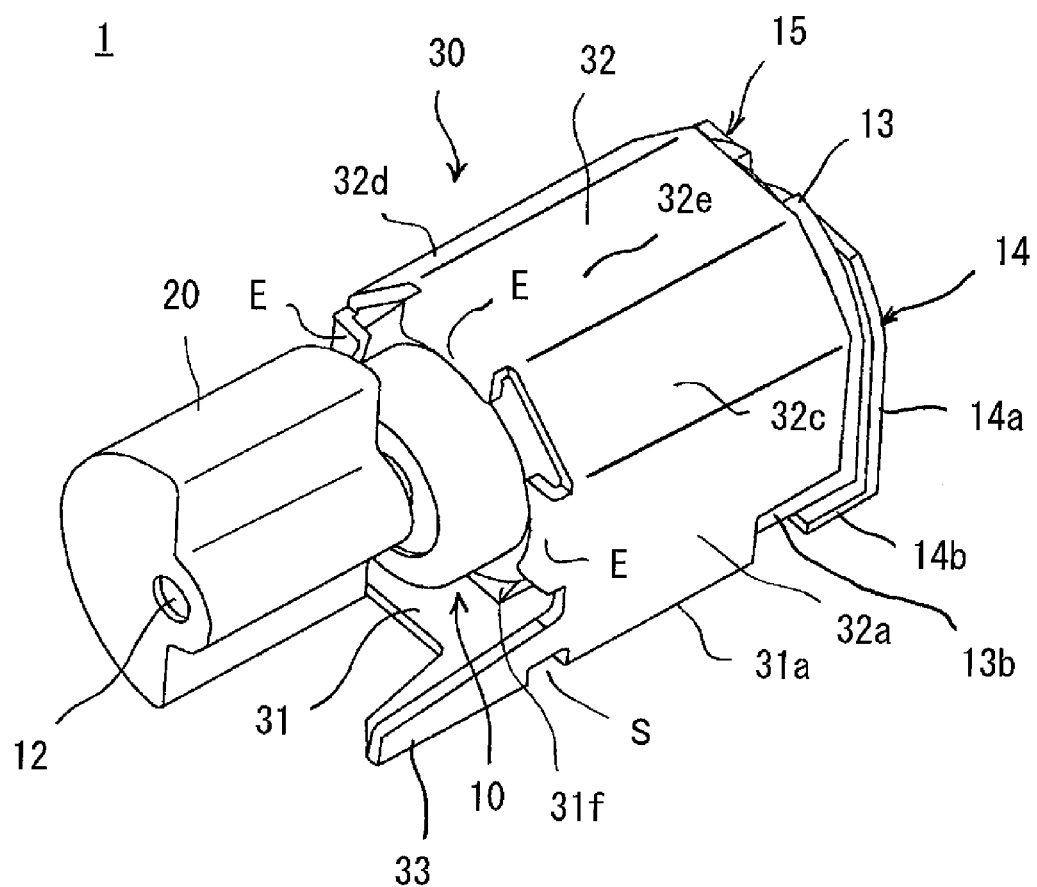
FIG. 1 is a perspective view of a vibration motor according to an embodiment of the present invention.

Preferred embodiments of the present invention will be described in detail below while referring to the attached figures.

As shown in FIGS. 1 to 4, the vibration motor1 1 of this example has a motor main body 10, an eccentric weight 20, and a metal holder frame 30. The motor main body 10 is provided with a motor shaft 12 projected from one end of a motor case 11 having a round-shaped circumferential surface and a pair of external terminal pieces 14 and 15 attached to a plastic end cap (end bracket) 13 for covering an aperture at the other end of the motor case 11. The eccentric weight 11 is attached to the projected motor shaft 12. The metal holder frame 30 has a tubular shape and is provided with a wall surface 32 having a domal structure rising up from both-side edges 31a and 31b of a flat bottom part 31.

The metal holder frame 30 is obtained by press forming of one metal plate. The flat bottom part 31 is a surface which is to be adhered to a fixing pattern of a printed wiring board (not shown) by reflow soldering. The metal holder frame 30 has an inner projection part 31f with a bottom-up recess part W for forming a solder chamber. In the metal holder frame 30, the wall surface 32 having the domal structure includes a rising-up walls 32a and 32b formed by bending the both-side edges 31a and 31b, sloping walls 32c and 32d formed by bending the rising-up walls 32a and 32b, and a top wall 32e formed by bending either one of the sloping walls 32a and 32b. At the front ends of the rising walls 32a and 32b and the top wall 32e, stoppers E are formed by bending them for colliding and stopping the front end side of the motor case 11 which is to be inserted in the axial direction into the inside of the wall surface 32 having the domal structure. Finally, the upper parts of the rising walls 32a and 32b, the sloping walls 32c and 32d and the top wall 32e in the domal-structure wall part 32 are protruded backward with respect to the flat bottom part 31.

From the both-side edges 31a and 31b of the flat bottom part 31, tapered protruding parts 33 and 34 are integrally formed to be protruded forward. The protruding parts 33 and 34 have rectangular cross section. The tapered protruding parts 33 and 34 are formed by bending the extending parts of the flat bottom part 31 and the extending parts of the rising walls 32a and 32b to be aligned to the both-side edges 31a and 31b. To make it easy to bend and form, cuts S are formed at the base portions of the tapered protruding parts 33 and 34.

Figure 4:
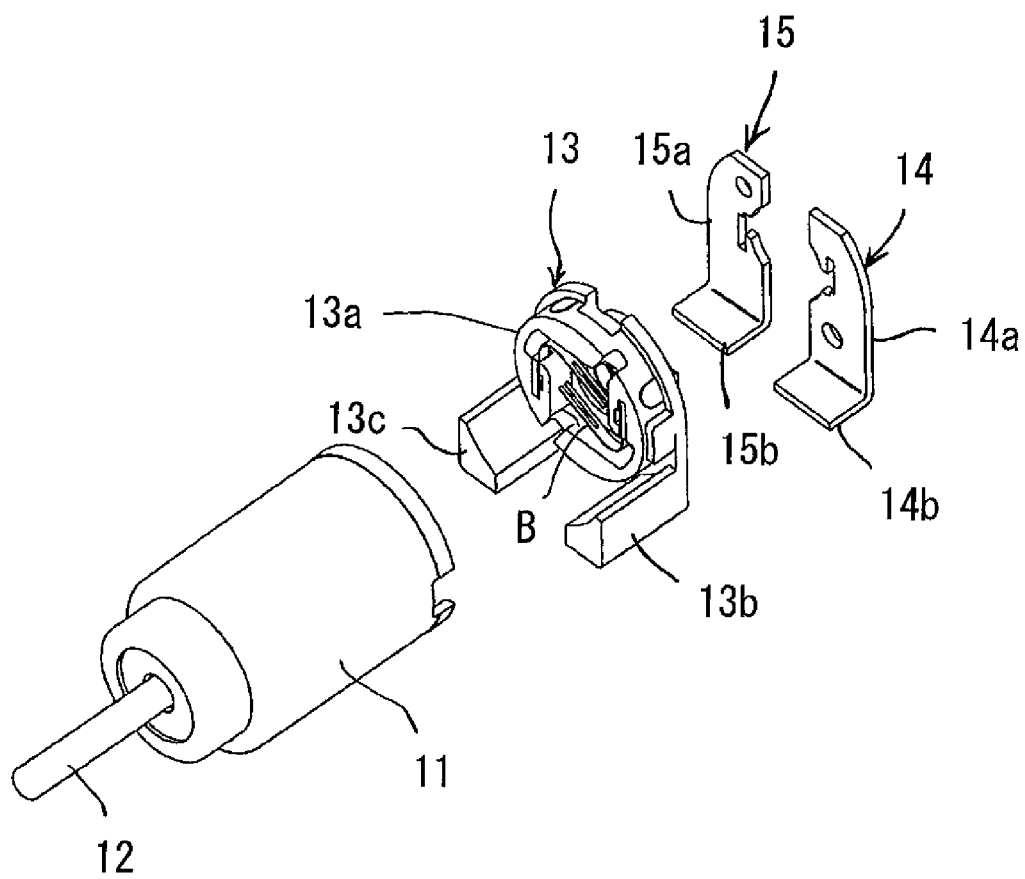
FIG. 4 is an assembling diagram of the body of the vibration motor.
Figure 5A:
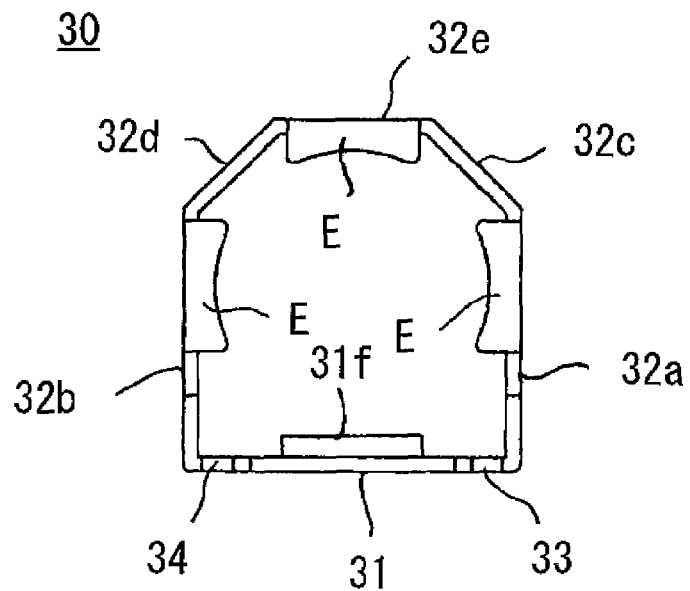
Figure 5B:
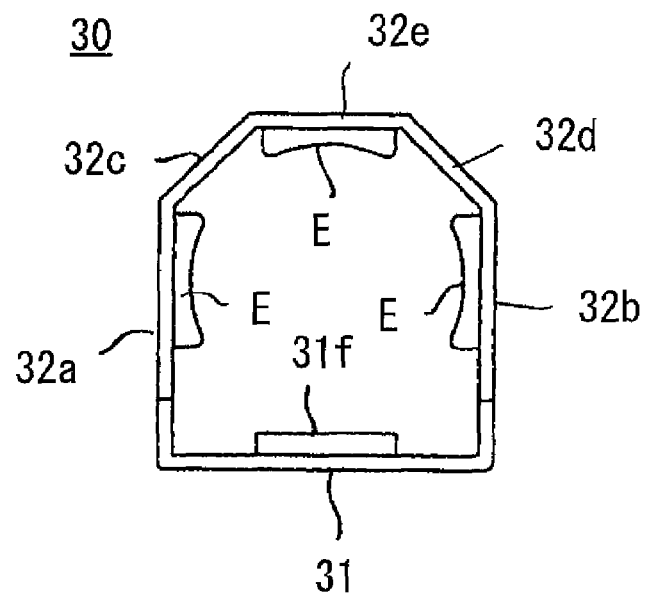
FIG. 5B is a back view of the metal holder frame.
Figure 6A:
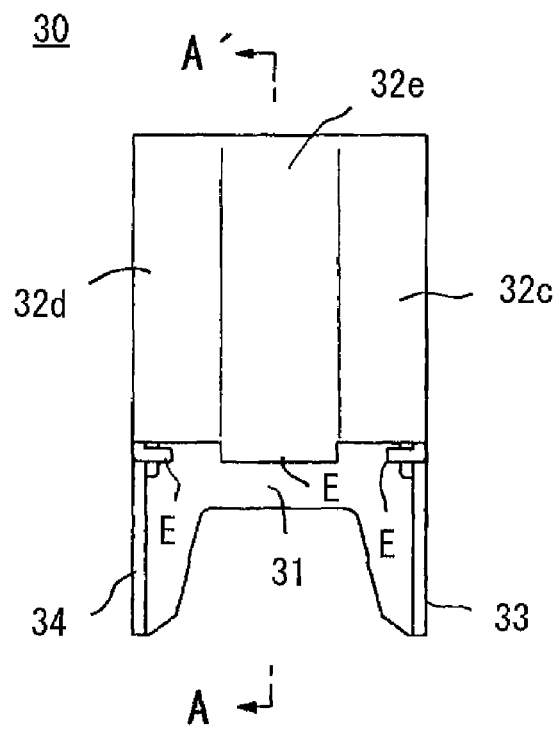
Figure 6B:
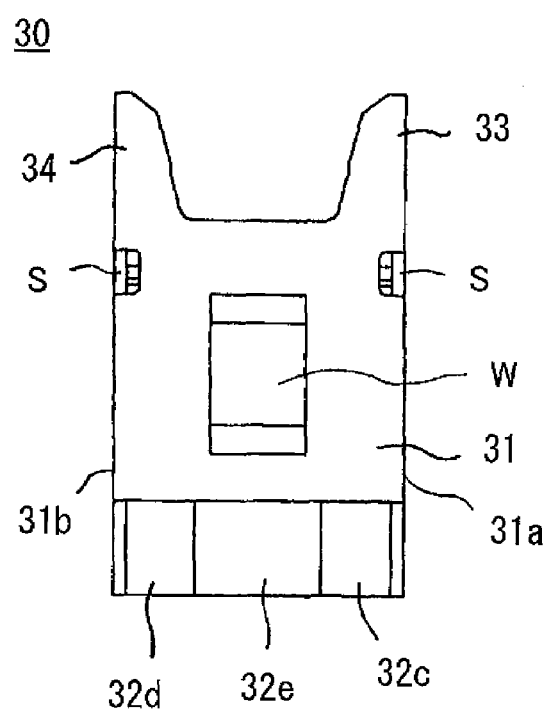
FIG. 6B is a bottom view of the metal holder frame.
Figure 7A:
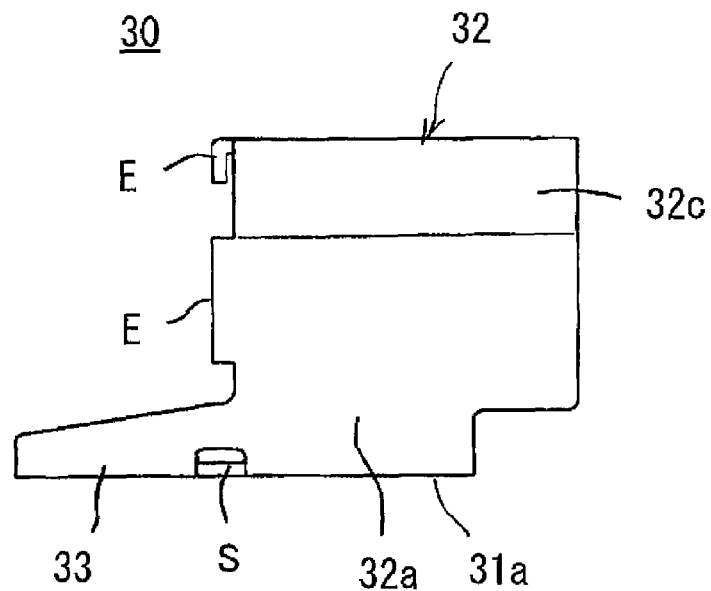
Figure 7B:
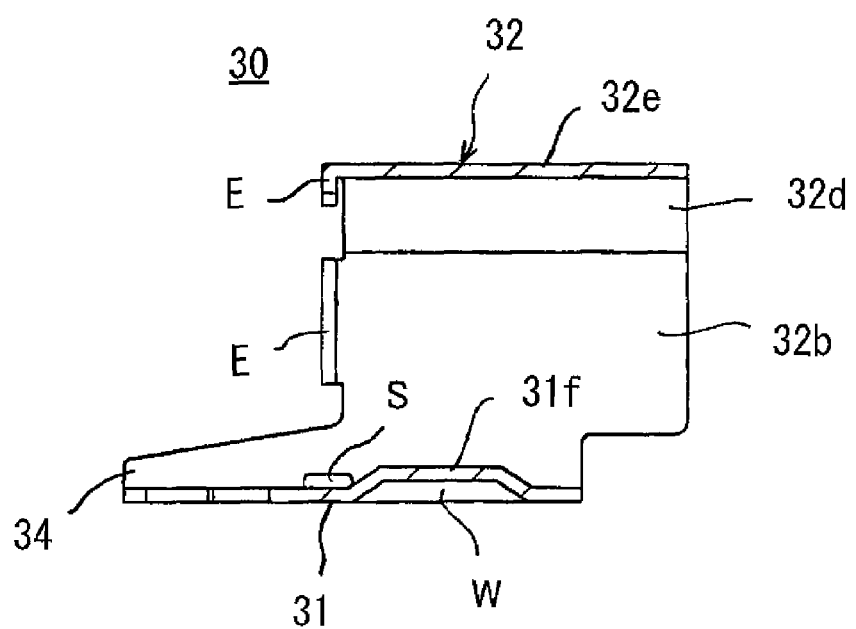
FIG. 7B is a cross-sectional view of the state cut by line A-A' in FIG. 6A.

As shown in FIG. 4, the plastic end cap 13 integrally has a cylindrical part 13a which is to be attached to a brush unit B so as to be fitted to the opening of the motor case 11, and a pair of spacer projections 13b and 13c abutting against the round-shaped circumferential surface of the motor case 11 and abutting against the insides of the both-side edges 31a and 31b of the metal holder 30. Each of the external terminal pieces 14 and 15 is of L type and is comprised of splicing parts 14a and 15a soldered to motor terminals (not shown) got through the cylindrical parts 13a of the plastic end cap 13, and connecting parts 14b and 15b positioned at the same level of the flat bottom part 31 and soldered to a feed pattern of the printed wiring board (not shown) by reflow soldering.

Figure 2:
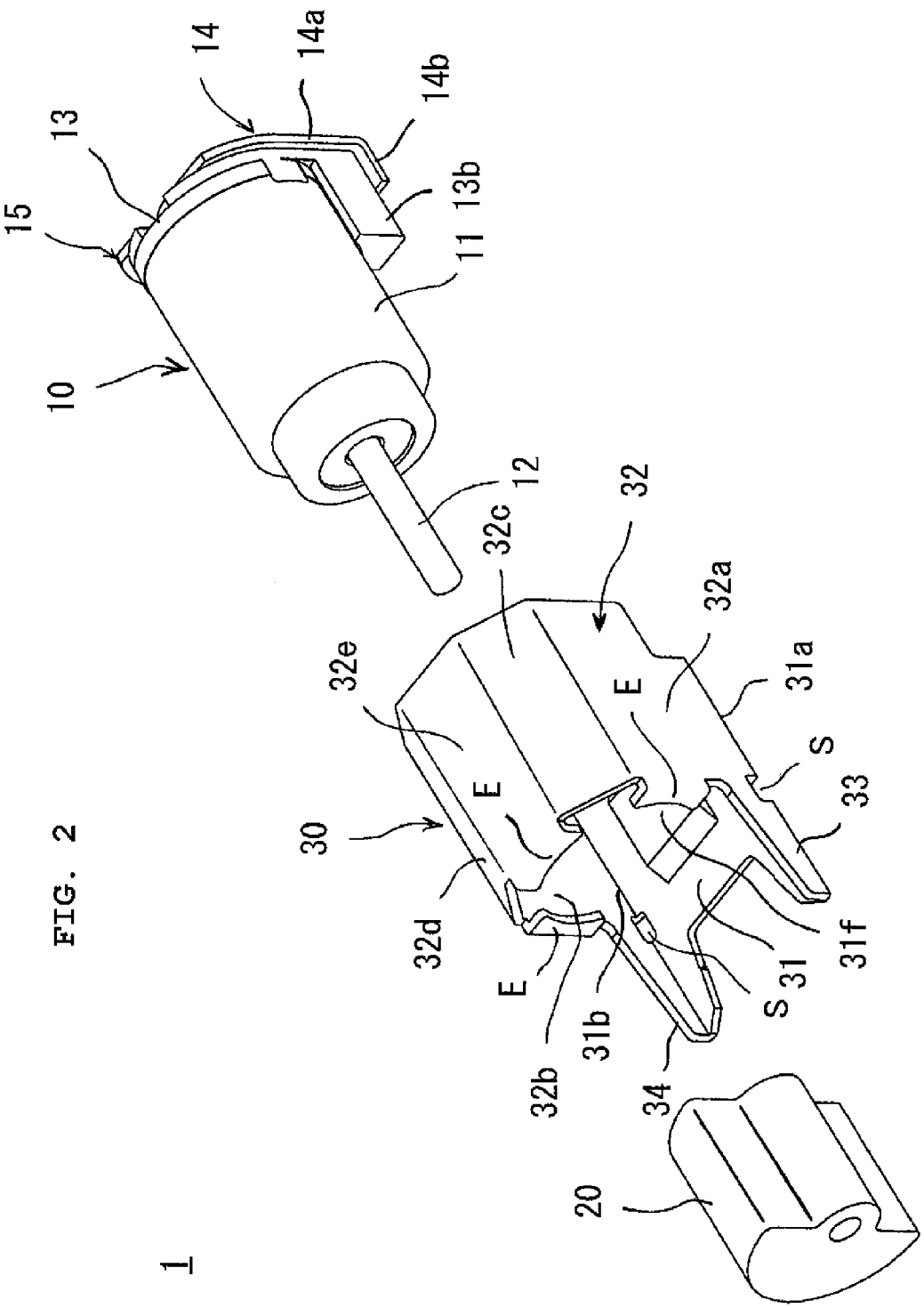
FIG. 2 is an exploded perspective view of the vibration motor.
Figure 3:
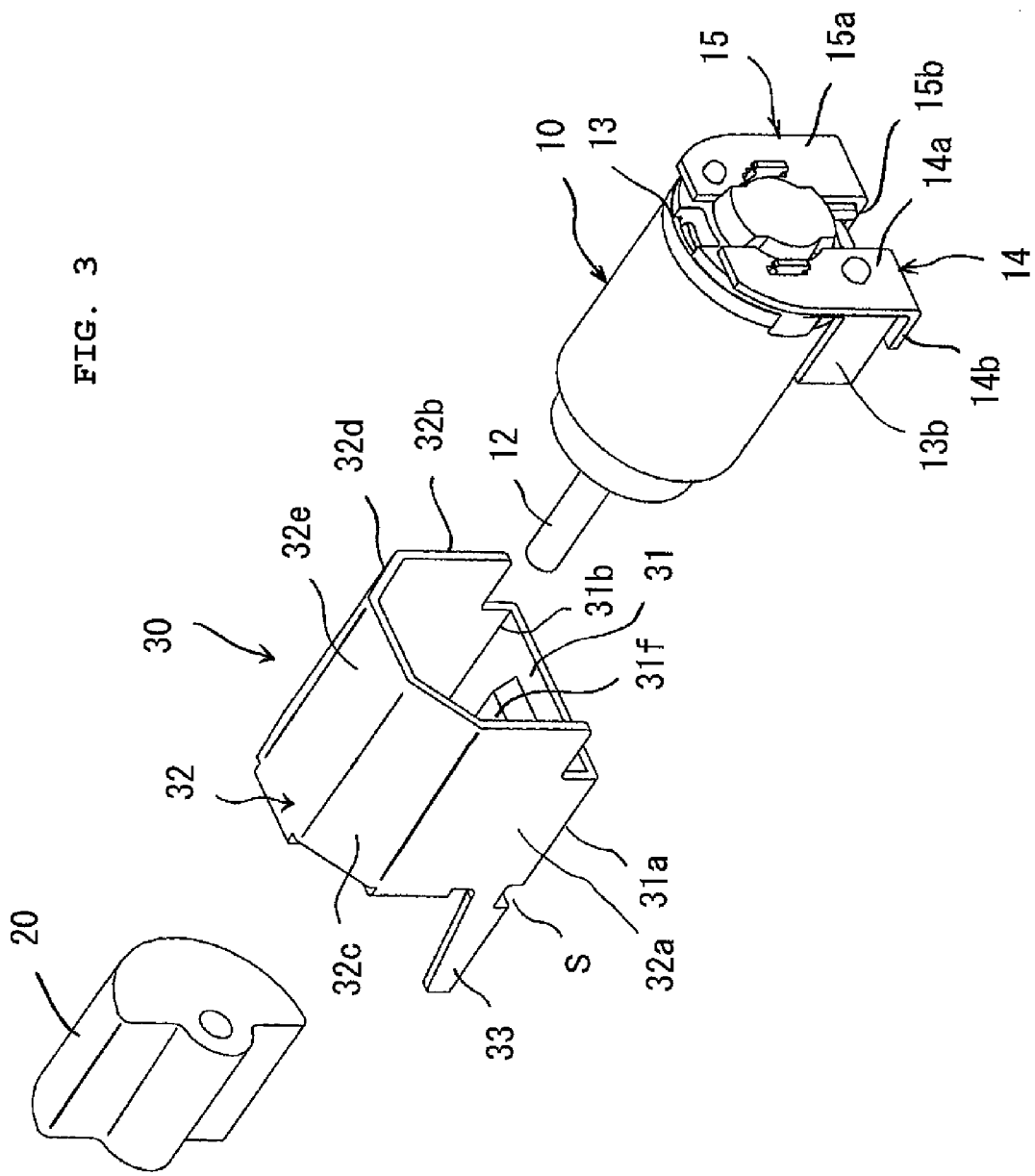
FIG. 3 is an exploded perspective view of the vibration motor when viewed from another angle.

To assemble the above-mentioned vibration motor 1, as shown in FIG. 1 and FIG. 2, the motor main body 10 is inserted in the axial direction into the rear side of the metal holder frame 30, and then the eccentric weight 20 having a larger outer diameter is fixed to the motor axis 12 by plating and swaging. Since the metal holder frame 30 does not have the pair of sandwiching pieces having an open upper part but has the wall surface 32 having a domal structure rising up from both-side edges 31a and 31b of a flat bottom part 31, and the motor case 11 has a cylindrical shape to be inserted in the axial direction to be held, the holding of the motor case 11 does not tend to leave from the metal holder frame 30 even when a shock is generated. In addition, since the spacer projections 13b and 13c of the plastic end cap 13 are inserted between the motor case 11 and the both-end edges 31a and 31b of the flat bottom part 31 by wedge pressure, the holding of the motor case 11 does not tend to be loosened so that the impact resistance can be improved. When the motor case 11 having the round circumferential surface is inserted into the metal holder frame 30, the circumference of the motor case 11 will elastically run on the inside projection 31f so as to be tightly fastened by the wall surface 32 having the domal structure, the motor case 11 with the round circumferential surface can be fixed and held. Note that the top sides of the spacer projections 13b and 13c are inserted into both sides of the inside projection 31f.

The metal holder frame 30 integrally has tapered projections 33 and 34 each having a rectangular cross section. The tapered projections 33 and 34 are projected to the both sides of the eccentric weight 20 from the both-side edges 31a and 31b of the flat bottom part 31. Therefore, when the vibration motor 1 is mounted on the printed wiring board (not shown), the vibration motor 1 can be prevented from being fallen forward by the heavy eccentric weight 20 due to the supporting function of the tapered projections 33 and 34. In addition, the fixing area can be expanded. In particular, since each of the tapered projections 33 and 34 has the rectangular cross section, the rigidity against deflection becomes high so that any deformation due to bent over of the tapered projections 33 and 34 when a shock is generated can be prevented.

What is claimed is:

1. A vibration motor comprising:
   a vibration motor main body provided with a motor shaft projected from a motor case, an eccentric weight being attached to said motor shaft;
   a metal holder frame having a tubular shape, the tubular shape surrounding the vibration motor main body and comprising a flat bottom part and a wall surface, said flat bottom part having an inner projection with a bottom-up recess part, said wall surface having a domed profile rising up from both-side edges of said flat bottom part; and
   a plastic end cap including a pair of external terminal pieces attached to the plastic end cap for closing an opening of the motor case at an end opposite to said eccentric weight; wherein
   said plastic end cap integrally and unitarily includes a pair of spacer parts inserted between and abutting against said motor case and the inner sides of the both-side edges of said flat bottom part to exert wedge pressure.

2. The vibration motor as claimed in claim 1, wherein said metal holder frame integrally and unitarily comprises tapered projections each having a rectangular cross section, said tapered projections being projected to the both sides of said eccentric weight from the both-side edges of said flat bottom part.

* * * * *